United States Patent [19]

Schram

[11] Patent Number: 4,938,654

[45] Date of Patent: Jul. 3, 1990

[54] AUTOMATED WAFER INSPECTION SYSTEM

[76] Inventor: Richard R. Schram, 11435 Tampa Ave., #94, Northridge, Calif. 91326

[21] Appl. No.: 149,391

[22] Filed: Jan. 28, 1988

Related U.S. Application Data

[62] Division of Ser. No. 735,822, May 17, 1985, Pat. No. 4,818,169.

[51] Int. Cl.$^5$ .......................................... B65G 47/24
[52] U.S. Cl. .................................... 414/757; 414/225; 414/752; 414/627; 414/744.2; 198/394
[58] Field of Search ........... 414/754, 757, 783, 744 B, 414/752, 749, 750, 627, 225, 744.2; 198/394, 395

[56] References Cited

U.S. PATENT DOCUMENTS

| | | | |
|---|---|---|---|
| 3,902,615 | 9/1975 | Levy et al. | 414/416 X |
| 4,103,232 | 7/1978 | Sugita et al. | 198/394 X |
| 4,402,613 | 9/1983 | Daly et al. | 414/416 X |
| 4,427,332 | 1/1984 | Manriquez | 414/416 X |
| 4,457,664 | 7/1984 | Judell et al. | 414/751 X |
| 4,534,695 | 8/1985 | Stump et al. | 414/749 |

*Primary Examiner*—Frank E. Werner
*Attorney, Agent, or Firm*—Merchant, Gould, Smith, Edell, Welter & Schmidt

[57] ABSTRACT

A high precision automated wafer inspection station provides a base table area on which an X-Y stage is movable in mutually orthogonal directions relative to an inspection axis in alignment with a microscope or measuring instrument which is mounted on a bridge support above the table. The stage mechanism includes a wafer-supporting vacuum chuck having a top engagement surface for receiving and retaining the wafer, the chuck being rotatable about a central axis to provide angular positioning of the wafer, and focusable along the inspection axis. The wafer is moved on a dual probe mechanism in a horizontal plane from a first cassette controlled by an elevator at one side back to the first cassette, or to a second cassette controlled by an elevator at the opposite side of the table area. The robe is driven from side to side on a trolley coupled on a piston within a cylinder having a movable seal, and the cylinder itself is movable along an orthogonal axis for entry into and withdrawal from the various mechanisms. Small delta motions of the cassettes and of the vacuum chuck on the movable stage are used for secure but dust free movement of the wafer, and transfer between the different operative positions. The X-Y stage may be moved in extremely small increments of movement to position selected microareas within predetermined dies on a wafer at the inspection axis.

3 Claims, 5 Drawing Sheets

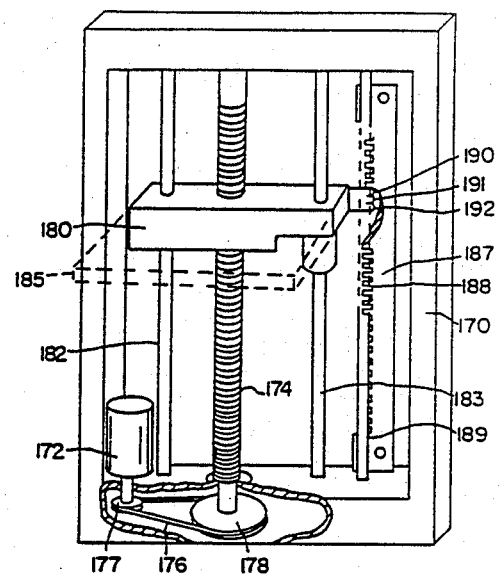
FIG.6
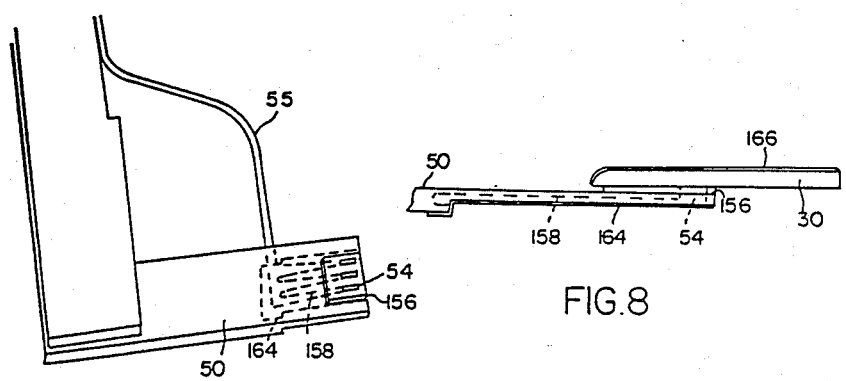
FIG.7
FIG.8

AUTOMATED WAFER INSPECTION SYSTEM

This is a division of patent application No. 735,822, filed May 17, 1985 which issued as U.S. Pat. No. 4,818,169 on Apr. 4, 1989.

BACKGROUND OF THE INVENTION

This invention relates to systems for handling precision elements for inspection, and more particularly to systems for transporting semiconductor wafers between supply, inspection and collection points with extremely precise positioning and automatic control.

In the chip manufacturing phase of the semiconductor industry, the chips are defined on a large silicon or other crystal wafer in the form of a disk now often six inches in diameter and circular outline except for major and minor flats on the periphery. This wafer receives a rectangular array of small identical patterns, each including the minute lines, active elements and electrical components that make up a specialized or general purpose chip in the present state of the art. Many hundreds of patterns can be disposed on a wafer and each must be laid down with submicron precision, inasmuch as line widths and elemental areas are now very small. It is evident that when successive layers are to be built up for each pattern on the wafer, they must be carefully checked, at least on a statistical basis, before further processing can be undertaken. For example, when a pattern is to be laid down, a layer of photoresist is first disposed on the wafer, and then each pattern area receives an exposure, as by a step and repeat optical system. After the exposure and subsequent fixation of the photoresist material, unfixed material is washed off for the next deposition step. At any or all such steps optical inspection may be used to determine if defects have been introduced from misalignment, faulty chemicals, impurities or other causes. In many instances corrective steps may be taken, while in others only parts of a wafer may be used. In the extreme cases, the wafer is discarded as not suitable for further processing. Despite the automation of many other procedures within the semiconductor industry, optical inspection by trained operators or with highly precise equipment remains at integral and essential procedure.

Optical inspection of semiconductor wafers demands precision placement of the wafers relative to the optical axis of a high resolution microscope. The wafer has precise edge flats defining positional references for the patterns on the wafer, so that particular patterns can be located from these indicia. Initially the industry used manual placement of the wafer on a precision stage manually movable in two directions under an optical microscope mounted on an cantilever support and viewing along an inspection axis. The inspector would then use fine positioning controls to shift the stage in X and Y directions to bring the desired pattern into view. The problems with this were manyfold, starting with the danger of dropping the wafer In addition, manual positioning was time consuming, not at accurate as desired, and the mechanisms that gripped the wafer would mar a portion of the surface, introduce contamination, or both. As the resolution of images steadily increased, any contaminating particulate that settled on a pattern might be of large enough size to introduce an invalidating defect in the pattern or even the entire wafer. Smaller pattern sizes and line widths materially increase the contamination danger because the most carefully designed and built belt and pulley mechanisms car give off minute but interfering matter.

Since the initial efforts there have been devised a number of semiautomatic wafer handling techniques. Wafers are now stored and transported in cassettes, which have storage slots, open at one side, in each of which slots a wafer is disposed, spaced apart from adjacent wafers. A transport mechanism can then probe into a given position on the cassette, lift a wafer from its storage location and transport it to the inspection stage at which the inspector can then finely position and inspect without handling the wafer itself. This alone, however, is time consuming because of the many thousands of discrete positions within each chip pattern.

Some inspection procedures now are substantially automatic, as for example in the measurement of linewidth. If a given line in a particular pattern on a wafer is presented at the optical axis, a specialized linewidth measurement system scans across it and reads out the actual linewidth, typically in microns or some related scaled units. Thus by statistically sampling different locations on a wafer a decision as to whether to reject, reprocess or move on to further processing can more readily be made. Clearly, then, with the need for repeated and extremely precise inspection there has long been a need for a fully automated wafer inspection system that quickly extract a chosen wafer from a supply, positions a given zone within a given one of many patterns on the wafer at the inspection region, enables an automatic measurement to be made or visual inspection to be undertaken without additional steps, and then transfers the inspected wafer to an appropriate storage category.

Despite this long felt need, there are many reasons that suitable systems meeting these requirements have not heretofore become available. Using a large precision mechanism can itself introduce substantial contamination, as well as increase costs disproportionately to the inspection rate of an individual inspector. The handling mechanism must thus be free of frictional abrasive effects, and retain the wafer in such a way that a coating, as a photoresist coating, on the top and edges of the wafer is totally undisturbed. It must not only position the wafer in fractions of a micron in X and Y directions, but must also rotate it in accordance with the orientation of a line or area to be inspected. A further problem arises from the instability of the viewed image. At the magnification that must now be used for inspection of high resolution patterns, the prior art does not provide an adequately stable platform for the microscope, and every vibration is transmitted because of the cantilevered mount used for the microscope.

SUMMARY OF THE INVENTION

Systems in accordance with the invention satisfy the requirements for fully automated wafer or other precision element inspection system in terms of freedom from contamination, ease of use stability and speed of operation, as well as cost. A precision microscope is mounted on a bridge support extending from the side supports above a horizontal table within which a compact motor driven stage is movable in two orthogonal directions under the microscope. The stage includes a vertical axis rotary drive surmounted by a top wafer chuck having an upper surface with vacuum engagement means for the wafer. With the stage area bounded by wafer cassettes movable relative to a horizontal inspection plane, a wafer gripping transfer mechanism is movable in two orthogonal directions to put a wafer from one cassette onto the chuck and move it back to one cassette or the other. The wafer is maintained substantially in the horizontal plane and incremental vertical motions are employed along with actuable vacuum devices for securely holding the wafers. At the inspection position the wafer is rotated and the stage is concurrently moved under microprocessor control to compute actual position by sensing the edge location as the wafer is rotated. With position calculated, the wafer can be positioned within fractional micron accuracy at different positions within specilfic patterns on the wafer.

In a specific example, the chuck is movable up and down by vacuum means an incremental amount relative to the horizontal wafer transport plane in which the wafer is to be transferred. Cassettes, which may be one of several different types, are mounted on elevator devices at each side of the frame, and are movable to different nominal elevations with reference to changeable encoder strips. In addition, for wafer transfer the elevator mechanisms generate an incremental or delta motion relative to the horizontal plane. A laterally translatable trolled which includes two probes with vacuum edges extending from the trolley in the direction toward the cassettes is supported on a reciprocable drive mechanism that moves the probes normal to the direction of wafer transport. The probes penetrate under a selected wafer, the wafer is moved incrementally downward, and the probe tip grips an underside edge of the wafer free of the edge and side surface for withdrawal of the wafer from the cassette. The transport mechanism comprises a pneumatically actuable piston within a cylinder, the piston being movable between limit positions and coupled to the trolley by a dynamic seal. The probes are spaced apart by the same distance as is used between the central vacuum chuck and cassette in each side. The piston and cylinder arrangement are mounted on a slidable pneumatically driven support extending out from the frame that provides the desired insertion and extraction motions at each limit position. In a fully automatic mode the system is controlled by a microcomputer so that a selected wafer is presented at the horizontal plane, extracted by the probe, removed from the cassette, transported to the inspection position, placed on the vacuum chuck, precisely positioned at a series of predetermined lines relative to individual ones of the dies or patterns on the wafer and then returned to the appropriate cassette after inspection. By constantly moving inspected wafers, whether satisfactory, needing rework or rejects, to the second cassette the transfer sequence can be considerably reduced by dual handling.

A significant feature of the invention lies in the geometry of the bridge support structure above the horizontal working table area which provides a rigid, vibration free base for a high precision microscope. There is, however, no inconvenience to an inspector using the microscope. Automatic line measuring or other equipment may be mounted on the bridge support, with like stability and firmness. Transport of the wafers is conducted in the horizontal plane on the opposite side of the support structure from the operator, and the inwardly and outwardly movable trolley uses a particularly compact and direct geometry for providing the two orthogonal motions.

Another feature of the invention resides in the compact but extremely precise mechanism for providing control of position in X, Y and angular position. The horizontal table table area comprises superimposed beds each movable in submicron steps under the control of microstepping motors which drive rack and pinion mechanisms, the racks being spring mounted for zero backlash. The upper one of these beds supports a vertical shaft mechanism which is motor driven to rotate the vacuum chuck, and which also incorporates a vacuum displacement mechanism for adding a vertical increment of motion to the vacuum chuck.

The angular drive and vacuum chuck also include an extendable coupling from the motor shaft to allow the vertical delta motion, and a focus motor drive that enables very precise control of wafer position relative to a focal plane.

BRIEF DESCRIPTION OF THE DRAWINGS

A better understanding may be had by reference to the following description, taken in conjunction with the accompanying drawings, in which:

FIG. 6 is n enlarged broken away perspective view of a cassette elevator mechanism used in the system of FIGS. 1 and 2;

FIG. 7 is a perspective view of a vacuum actuated probe mechanism used in the system; and FIG. 8 is a side sectional view of a portion of the probe mechanism of FIG. 7.

DETAILED DESCRIPTION OF THE INVENTION

Figure 1:
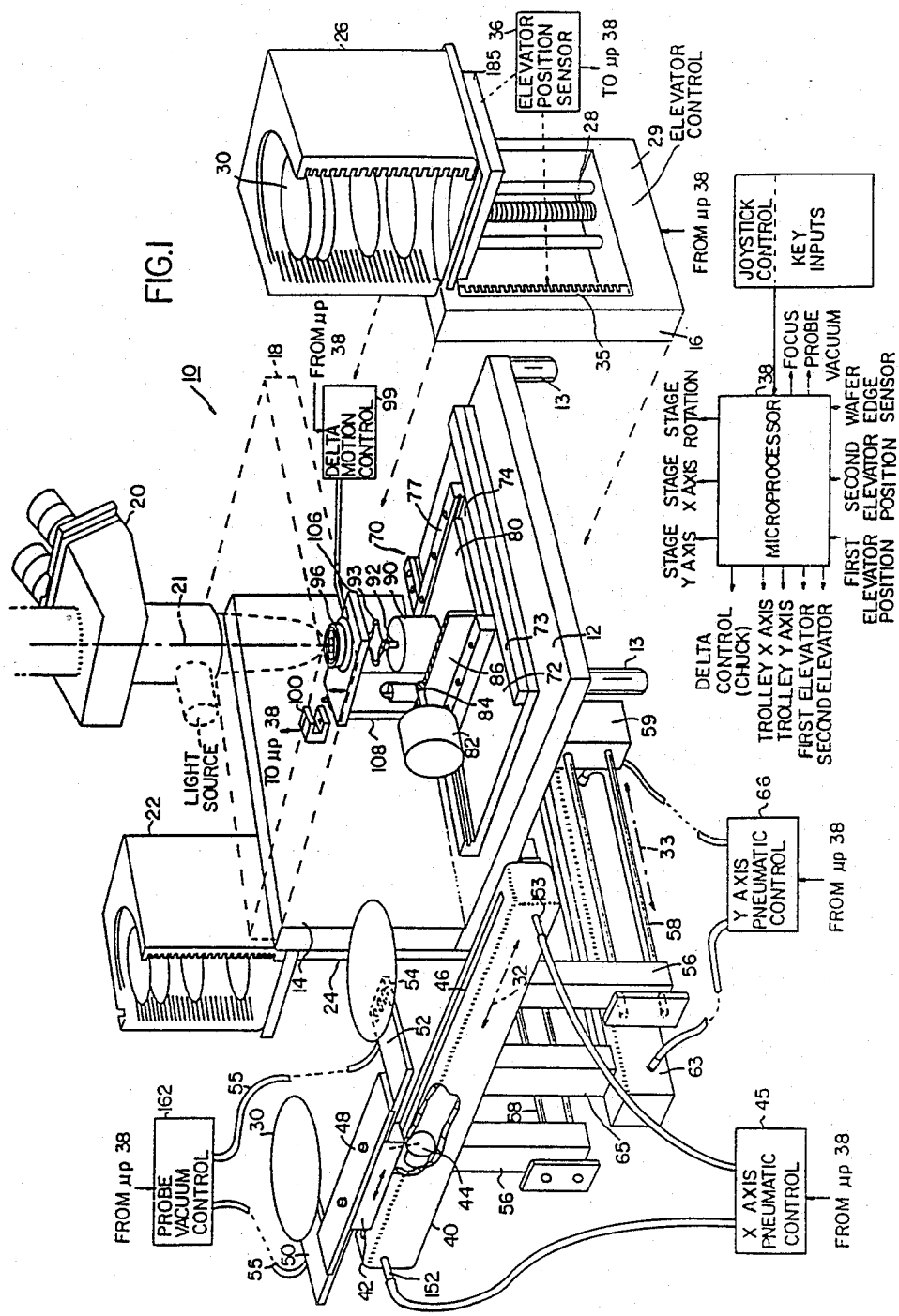
FIG. 1 is a combined perspective view, partially broken away, and block diagram of an automated wafer handling system in accordance with the invention, as viewed from the side opposite the user.
Figure 2:
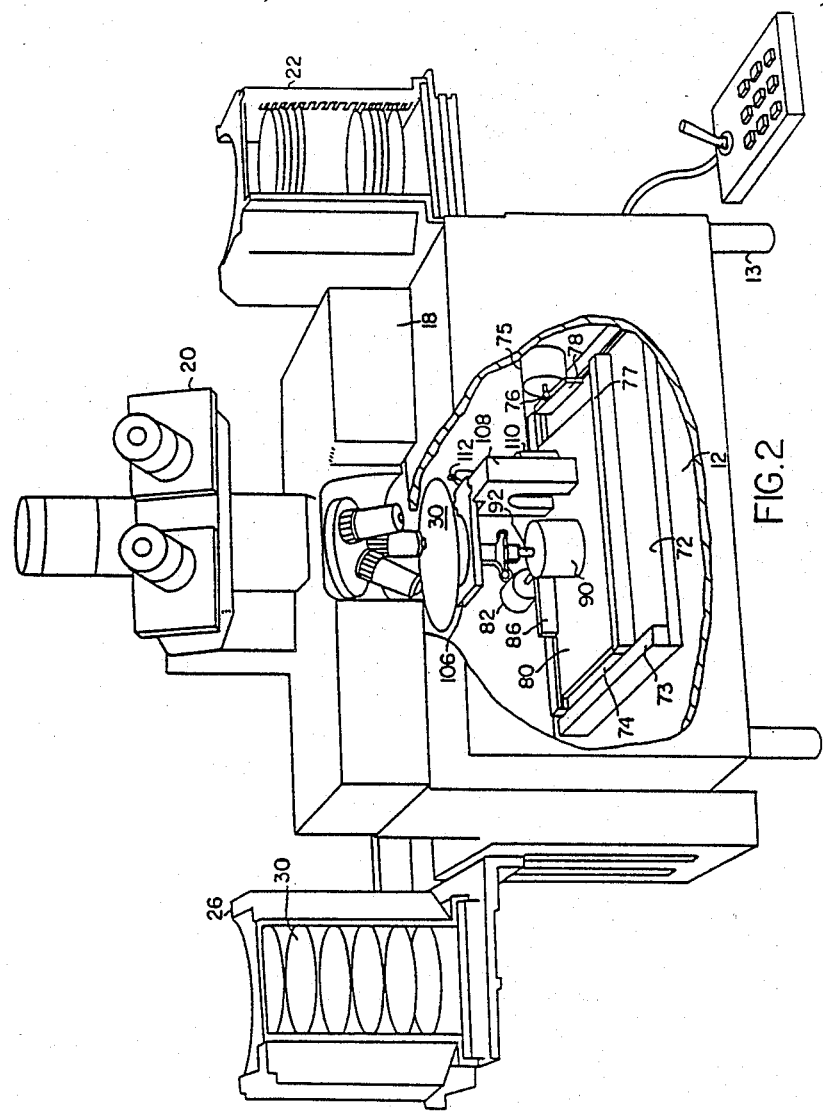
FIG. 2 is a front perspective view, partially broken away, of the arrangement of FIG. 1 showing further details thereof from the side of a user of the arrangement.
Figure 4:
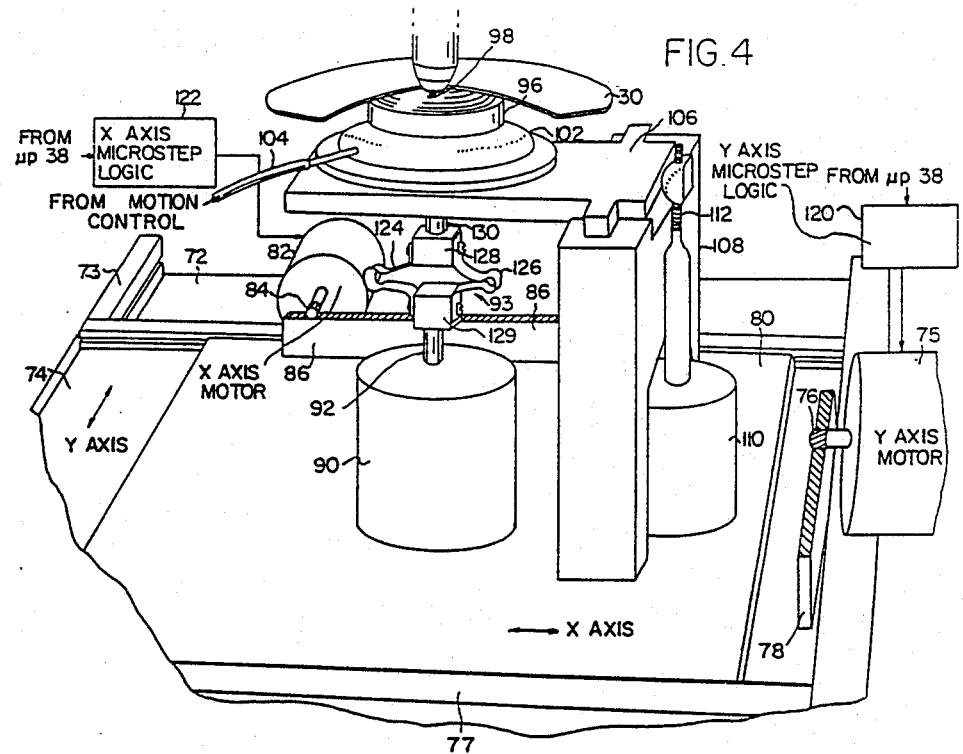
FIG. 4 is a perspective view, partially broken away of a universal stage mechanism used in the system of FIGS. 1 and 2.

A wafer positioning system 10 in accordance with the invention is depicted in perspective, broken away and partially exploded form in FIGS. 1, 2 and 4, employed with 6" semiconductor wafers that are to be taken from a supply in any desired order, inspected visually or automatically, and then accepted for further processing or rejected. A stable base for the system is provided by a horizontal reference area 12 mounted on legs 13, and overlying certain portions of the mechanism, as described below. The area and shape of the reference surface 12 are determined by the extent of motion to be imparted in mutually orthogonal directions by a stage mechanism which is mounted upon it, as is also described below. The reference surface 12, however, is suitably massive to support the remainder of the structure in stable and vibration free fashion, and has a precision finished surface to insure that XY stage mechanisms can be moved to different positions without material height deviations. First and second side supports 14 and 16 are mounted along opposite parallel edges of the reference surface 12 these being shown generically as rectangular panels, although they may take other forms, such as corner posts or a framework construction. Whatever configuration is employed, it is desirable to have a suitably massive and vibration free support for a top bridge member 18 that provides a direct mount for a precision microscope 20. The microscope 20 is mounted along an inspection axis 21 perpendicular to the horizontal reference surface 12, and intercepts that surface 12 in a central or at least interior region. The microscope 20 may include internal reflectors (not shown) for providing an image for analysis by an automatic device on a separate axis. In accordance with the present invention, therefore, the desired positioning of a wafer with respect to the optical inspection axis is accomplished by a compact universal stage mechanism within the confines of the reference area and the support structure, while movement of the wafer is effected on the side of the system 10 away from the inspector using the microscope 20. If an automatic inspection system, such as a line width measuring system as disclosed by Richard R. Schram in issued U.S. Pat. No. 4,385,837 is used, then it is mounted on the bridge 18 with its optical magnification axis coinciding with the inspection axis 21. At the magnification ratios used for wafer examination, this inspection system 10 provides the first vibration tolerant handling and mounting mechanism.

As viewed in FIG. 1, which is from the side opposite the inspector using the microscope 20, principal wafer movement is assumed for the present example to be from left to right, so that where like parts are used on both sides those on the left are referred to as the first element and those on the right are referred to as the second of such elements, although the mode of wafer transport is wholly reversible, if desired. A left hand wafer cassette 22 is thus referred to as the first or supply cassette 22, and stores wafers as well as enables side access to the wafers. Within the cassette 22, which is of conventional construction used in the semiconductor industry, wafers are stored horizontally, suspended by edges only, in vertically stacked, spaced-apart relation. The entire cassette is moved up and down on an individual elevator 24, of a design that is seen in greater detail in FIGS. 2 and 6, and described in conjunction with a second cassette 26 that is immediately adjacent the right hand vertical support 16. The second elevator 28 comprises, as is described in more detail below, a lead screw operated by an elevator control motor 29 receiving control signals from an associated microprocessor.

Wafers 30 are taken from their known positions on the first cassette 22 to be transported laterally, in a given horizontal plane relative to the reference surface 12, to the region of the inspection axis 21. After being withdrawn from the inspection axis they are transported laterally to be returned to the first cassette 22, or entered into the second cassette 26, referred to in this example as a takeup cassette for accepted or rejected wafers, although wafers may also be returned to the cassette from which they were taken. For ease of reference, the lateral transport direction is referred to as the X axis 32, and the orthogonal insertion and withdrawal motions are then along the Y axis 33, which may also be referred to as the forward and reverse directions of movement.

The elevator control 29 may be operated in open loop fashion, as with a stepping motor, but is here operated in a closed loop made with reference to a toothed linear encoder 35. An elevator position sensor 36 parallel to the vertical axis is in the form of an interchangeable plastic strip with teeth denoting the storage positions on the cassette 28. As described below a photosensor device provides position signals to a microprocessor 38 that controls the positioning, transport and wafer exchange functions to be described below.

Wafer movement along the X axis 32 is accomplished by a laterally mounted wafer transport cylinder 40 parallel to the X axis and supporting a trolley 42 which is coupled to a piston 44 within the cylinder 40. The piston 44 is moved from one end of the cylinder 40 to the other along the X axis by pneumatic pressure from a control 45 that receives signals from the microprocessor 38. The direct coupling and compact arrangement are feasible because of a dynamic seal strip 46 that closes off an otherwise open side of the cylinder 40 despite shifts in linear position of the trolley 42.

A probe support bracket 48 mounted on the trolley 42 extends along the X axis, but couples to first and second probes 50, 52 elongated along the Y axis. The probes 50, 52 are spaced apart by a predetermined distance along the X axis, equal to the like spacings between the central inspection axis and the central vertical axes of symmetry of the wafers 30 on the wafer cassettes 22 and 26. This arrangement enables two cassettes to be handled simultaneously in moving from the left to the right directions as shown in FIG. 1. The terminal ends of the probes 50, 52 incorporate vacuum apertures 54 in a specific design, discussed in greater detail in conjunction with FIGS. 7 and 8, for gripping the undersides of the wafers 30 near but free of the edges. Flexible vacuum lines 55 are coupled to be controlled by the microprocessor 38.

The wafers 30 on the probes 50, 52 move within a horizontal plane at all times, except for small incremental vertical motions, called delta motions, that are used at the time of transfer of wafers 30 from one mechanism to another, as described in conjunction with the cassette elevators and vacuum chuck device Y axis motion of the wafer 30 within the horizontal plane is controlled by a mechanism mounted partially under the reference surface 12. Support posts 56 below the cylinder 40 extend vertically from guide rods 58 on which the posts 56 are slidable, and which in turn are mounted within support blocks 59 on the underside of the reference surface 12. A Y axis drive piston (not shown but corresponding to the piston 44 in the cylinder 40) within a Y axis cylinder 63 having a dynamic seal strip 64 and also mounted under the reference surface 12 is coupled by a movable post 65 to the underside of the X axis cylinder 40. The piston is driven between limit positions along the Y axis by pneumatic pressure governed by a Y axis control 66 that is operated by the microprocessor 38. This arrangement shifts the X axis cylinder 40 and wafers 30 in the horizontal plane between insertion and withdrawal movements to place wafers in position and remove them from position on the various mechanisms.

Within the volume above the reference surface 12, and below the lowermost portion of the microscope 20 or other optical mechanism, is mounted a universal stage mechanism 70 having controllable motions in the X and Y directions. The mechanism also provides delta motion in the Z or vertical axis, angular motion about the Z axis, and Z axis adjustment for wafer focus as well. A Y axis bed 72 is mounted between Y axis side rails 73 on the reference surface 12, and freely supports, by ball bearings along the sides of the side rails 73, a Y axis carriage 74. On one of the side rails 73 (or on the reference surface 12) a Y axis microstepper motor 75, best seen in FIGS. 2 and 4, is mounted for driving the carriage 74. A motor shaft having an end pinion 76 engages a rack 78 on the carriage 74 which may be biased toward the pinion 76 by a flexure or a spring to limit backlash.

The Y axis carriage 74 in turn has side rails 77 which freely supportss, on side ball bearings (not shown in detail) an X axis carriage 80. The Y axis carriage 74 acts as a base for an X axis microstepper 82 having a terminal pinion 84 in engagement with a rack 86 mounted on the X axis 80, which may also be biased against the pinion by a flexure (not shown).

The X axis carriage 80 is orthogonally movable in two directions because of the underlying Y axis carriage 74 on which it rests, and thus serves as an XY platform that supports mechanisms controlling rotation, delta motion and focusing motion. A Z axis motor 90 is mounted on the XY platform with its shaft 92 being along and rotatable about a vertical axis which serves as the nominal central axis for a wafer 30. An extendable drive coupling in the form of an elbow linkage 93 enables changing the effective length of the shaft coupling to a top surface chuck 96. The chuck 96 has a generally flat horizontal upper surface including surface grooves extending from a central aperture 98 (best seen in FIGS. 4 and 5) to which a vacuum can selectively be applied via a control 99 operated by the microprocessor 38. The chuck 96 can thus firmly grip a wafer 30 when it is positioned upon the chuck 96 surface.

Spaced apart from the inspection axis 21 at a predetermined distance, in line with the nominal horizontal plane, is a photosensor device 100 which straddles the edge of a wafer 30 moved into its region. The device 100 has a sensing area of only 0.001" diameter, for precisely detecting the edge of a wafer on the chuck 96. Signals from the photosensitive device are sent to the microprocessor 38 as a wafer 30 is rotated.

Figure 5:
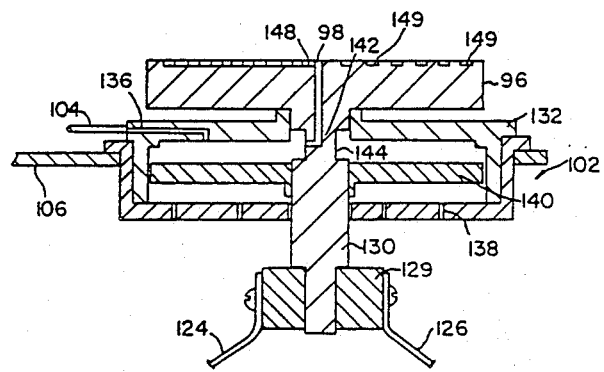
FIG. 5 is a side sectional view of a portion of the universal stage mechanism.

Two other motions are provided for the vacuum chuck 96, and the mechanism can be better appreciated by brief reference to FIGS. 4 and 5. The chuck 96 is mounted as the top member on a delta motion device 102 having a vacuum input 104 controlled from the microprocessor 38. The device 102 is arranged to introduce a specific upward incremental motion in the chuck 96, when activated, without affecting the rotary coupling. The chuck 96 and delta motion device 102 are both supported from lateral arm 106 that is vertically slidable in a side stand 108, and engaged to the shaft for the chuck 96 above the elbow linkage 93. A focusing motor 110 on the XY platform formed by the X axis carriage 80 turns a vertically oriented lead screw 112 that drives the arm 106 up or down depending on the direction of rotation.

Sequence of System Operation—In extracting the wafers 30 from the first or supply cassette 22, wafers can be taken in any order, although it is usually preferred to start from the top down so that if any dust or other contaminants intrude they will be visible on the lower wafers. However, the system 10 is free of exposed belts and pulleys, and when operated in a clean room environment new contaminants are not introduced by the mechanism.

Figure 3:
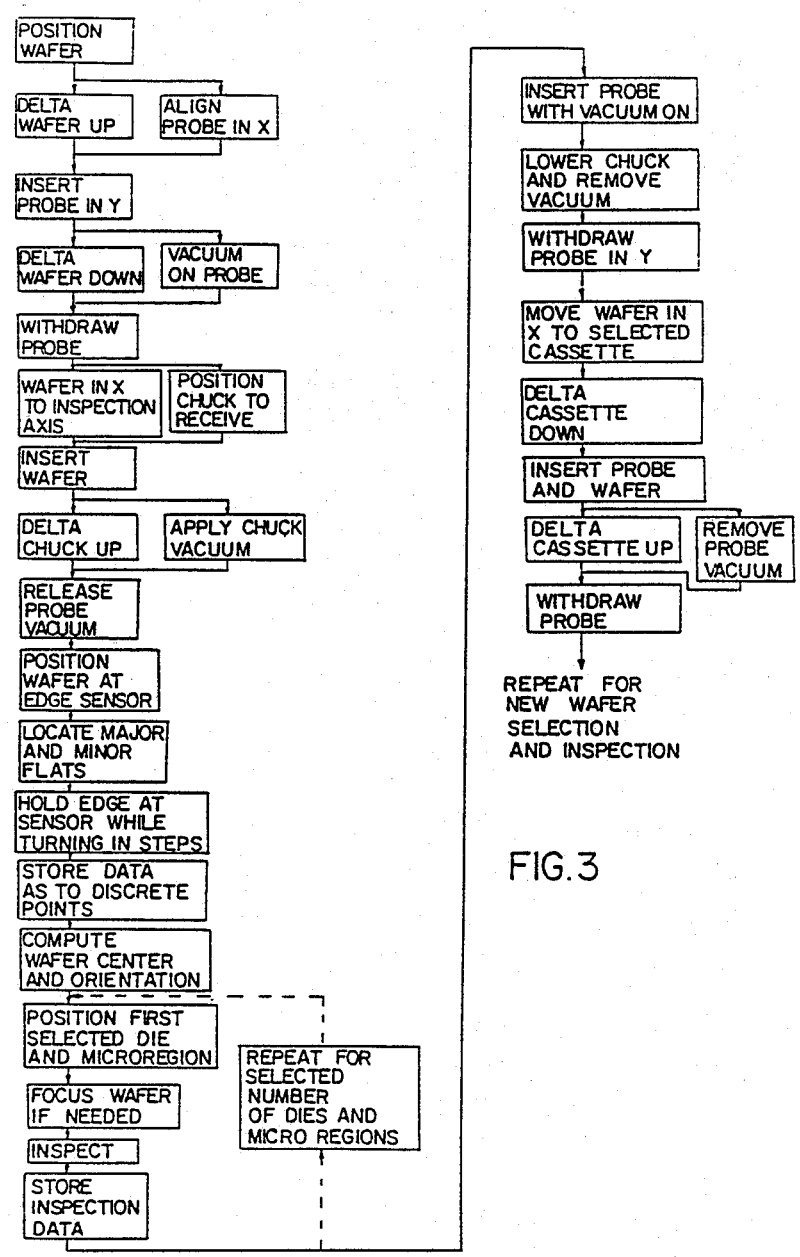
FIG. 3 is a flow chart showing principal steps in the sequence of operation of the system of FIGS. 1 and 2.

Referring now additionally to FIG. 3, which represents a typical flow chart of operation, somewhat simplified in order to reduce repetition, the transport and inspection operation starts with the first elevator mechanism 24 positioning the first cassette 22 so that a selected wafer in a particular slot position in the supply cassette 22 is at the horizontal plane. The trolley 42 is moved to its left limit (as seen in FIG. 1) position so that the first probe 50 is in alignment with the cassette 22 along the X axis. The first cassette 22 is moved incrementally upward to hold the chosen wafer 30 slightly above the horizontal plane, so that the probe 50 may enter under it with clearance. The Y axis control 66 is actuated to move the probe support bracket 48 and probe 50 forward, to its limit position at the cassette 22. At this position the probe 50 tip penetrates only about 0.060" under the edge of the 6" wafer 30, so that the vacuum apertures 54 at the end of the probe 50 are overlapped to this extent by the wafer edge. Before penetration, a vacuum is drawn at the apertures 54, and held until the wafer has been moved and is to be released.

The elevator mechanism 24 then lowers the first cassette 22 incrementally by about 0.120", transferring the wafer 30 weight from the side supports on the cassette 22 to the peripheral attachment of the probe 50 tip, rendering the wafer 30 completely free of the cassette. After transfer to the probe 50, the wafer 30 is withdrawn completely by actuation of the Y axis control 66 to move the support 58 and the trolley 42 to the withdrawal limit position, at which the wafer is clear of the cassette 22 and side support 14. The microprocessor 38 then directs the X axis pneumatic control 45 to move the trolley 42 and the wafer 30 in the horizontal plane along the X axis 32 until the wafer 30 reaches the opposite (right hand) limit of movement of the first probe 50. At this X axis position the wafer 30 is in approximate alignment along the X axis with a chosen perpendicular line intersecting an interior region of the reference surface 12. This line may intercept the inspection axis 21, but can be anywhere that the wafer 30 can be inserted with clearance above the reference surface 12. The vacuum chuck 98 is earlier o concurrently moved by microprocessor 70 control of the motors 75, 82 to a selected XY position, along the X axis line occupied by the wafer 30. The Y axis control 66, on command from the microprocesor 38, then moves the first probe 50 and wafer 30 forwardly to the limit position, at which it is approximately centered above the chuck 96. The delta motion device 102 is actuated to raise the chuck 96 an incremental amount, about 0.120", the vacuum input for the chuck being also energized. The vacuum on the probe apertures 54 is released concurrently but not before, the upward delta motion. Thus the wafer 30 is positively transferred to and firmly gripped on the chuck 96 by virtue of the vacuum drawn on the chuck central aperture 98 during the upward delta motion. After the delta motion to raise the wafer 30 incrementally above the horizontal plane, the chuck 96 is rotatable with the vacuum still holding the wafer in position.

The probe 50 is then retracted to its withdrawn position, at which it is clear of the wafer 30 and the internal mechanism of the universal stage 70. The precise position of the wafer 30 on the chuck 96, however, remains to be determined because the starting XY and rotational positions of the wafer 30 on the cassette 22 could not be known with exactitude.

In order to identify wafer 30 position with respect to its major and minor flats, therefore, the microprocesser 38 commands the universal stage mechanism 70 to move the wafer in X and Y toward the very small photosensor 100 until an edge is detected. The microprocessor 38 then undertakes an edge tracking algorithm, operating the motor 90 to rotate the wafer 30 about the central chuck 96 axis, while moving the wafer in X and Y to keep its edge at the photosensor 100. Various algorithms are available for this type of computation, inasmuch as they are based on conventional mathematical processes for determining the placement of a known circle having known edge deviations. In the present system it has been found satisfactory first to make a rough scan so as to locate the major and minor flats. Then a specific sequence of steps is undertaken, rotating the wafer in increments and positioning the wafer 30 so that its edge is at the sensor 100. Movement along only one axis (e.g. the Y axis) suffice for this purpose. In this example, the system ascertains and stores 80 X,Y coordinates during 360° rotation of the wafer 30. From this stored data the microprocessor 38 computes the disposition of the wafer 30 in X, Y, and angular orientation on the chuck 96. The multiple readings enable position to be determined to within 0.1 microinches, referenced to the wafer center and the major and minor flats along the edges. From this, the microprocessor 38 can then compute the movements needed in X, Y and rotation angle to place any desired line or point within a preselected die or pattern on the wafer 30 at the optical inspection axis. The inspection sequence typically utilizes sampling of a number of preselected dies on a multi-die array, such as dies at each of the four corners and one at the center of the array. For each die, one or more preselected lines or incremental areas is to be visually inspected or automatically measured.

A sequence therefore begins with movement of the wafer 30 to place the selected region of a first die at the inspection axis. When the inspection is complete, as indicated by a control signal from the inspector, or after an automatic inspection system has been operated, then the microprocessor controls the microstepper motors 74, 82 and 90 to put another select microregion of a die or pattern at the inspection axis 21. This operation is repeated for as many microregions as is desired. In this process it may be determined that the entire wafer 30 is unacceptable, that it is acceptable, or that one or more specific dies are to be rejected. This information is stored, and controls the subsequent disposition of the wafer 30, in accordance with the operating mode that is being utilized.

If, for example, it is desired to return an acceptable wafer 30 to the first cassette 22, then the chuck 96 is raised by the delta motion device 102. The first probe 50 is inserted to its forward limit so that the vacuum apertures 54 on its tip underlie the edge of the wafer 30. A vacuum is drawn on the vacuum apertures 54 as it is released from the vacuum apertures 98 on the chuck 96 by the control 99. Downward delta motion of the chuck 96 effects transfer of the wafer 30 to the probe 50, clearing the wafer 30 from the chuck 96. The first probe 50 is then withdrawn from the reference area 12 by the Y axis control 66, and the wafer 30 is transferred thereafter along the X axis back to alignment with the first cassette 22. A selected slot in the first cassette 22 is positioned at the horizontal plane, but the cassette 22 is displaced incrementally downwardly from its nominal position to ckear the wafer 30 edge. The probe 50 is moved forwardly on the Y axis until the wafer 30 is fully inserted. When the elevator mechanism 24 raises the cassette 22 in the upward delta motion, the vacuum on the probe apertures 54 is released as engagement takes place, retransferring the wafer 30 back to the first cassette 22. If all wafers 30 are deemed to be acceptable after inspection they will be, in this mode of operation, simply taken from the cassette in top/down sequence and returned to their original positions.

If one or more of the patterns on the wafer 30 is found to be unacceptable, then the wafer is extracted from the chuck 96 by the second probe 52 at the same time that a new wafer is being withdrawn from the first cassette 22 by the first probe 50. The two wafers on the respective probes 50, 52 are then moved outwardly on the Y axis to the fully withdrawn position, and transported along the X axis to the opposite limit position. In this position the new selected wafer is in alignment with the insertion position for inspection and the rejected wafer is in alignment with a selected slot on the second cassette 26. To achieve this the second cassette 26 has been moved by the elevator control 29 to its desired vertical position under control of the microprocessor 38, and has also been raised by the incremental distance for clearance. Transfer of the new wafer 30 to the chuck 96 takes place at the same time as transfer of the rejected wafer to the second cassette 26, the delta motions and vacuum switching being carried out concurrently.

As previously noted, only certain dies, identified during inspection, may be defective on a given wafer. Identifying information as to such factors may be recorded as a part of conventional data logging operations, each wafer being positively identified by its location in the cassette. If entire wafers are rejected and cannot be further processed, they can simply be marked for discard, as by being placed in the uppermost slot in the second cassette 26.

It will be recognized that the cassettes 22, 26 can be used interchangeably for supply, takeup and stroage, and that the system is fully bidirectional in operation.

Universal stage mechanism—Details of the universal stage mechanism 70 are better seen in the views of FIGS. 4 and 5, to which reference is now made along with FIGS. 1 and 2. The Y and X axis microstopper motors 75 and 82 are driven by logic circuits 120 and 122 which subdivide the steps of the pinions 76 and 84 respectively into many increments, giving individual steps of 0.3 microinches in the driven elements. The racks 78, 86 are urged against the driving pinions 76, 84 by a built in flexure pattern, insuring precise contact and limiting stepping and backlash errors. The ball bearing mounts on the side rails 73, 77 respectively for the Y axis bed 72 and the Y axis carriage 74 precisely maintain the horizontal disposition of the platform 80 and the various structures mounted on it during the XY motions.

The delta motion control 102 coupled to the rotational shaft 92 of the motor is arranged together with the focusing motor 110 and the vacuum chuck 96. The elbow linkage 93 comprises a pair of elbow members 124 and 126, here made of sheet beryllium copper to form a vertically displaceable coupling between a first block 128 coupled to the shaft 92 and a second block 129 coupled to the shaft 130 for the chuck 96, as best seen in FIG. 5. A stationary vacuum retaining chamber is defined in the delta motion control 102 by a pair of cup shaped elements 132, 133, which are mated together, with the top cup element 132 inverted so that an interior chamber is defined. Both elements 132, 133 rest on the lateral arm 106 used in microfocusing, and each fits closely about the chuck shaft 130 so as to limit air leakage. A piston 140 coupled to the chuck shaft 130 is movable up and down within the chamber of the delta motion control 102, being pushed upward when a vacuum on the line 104 is drawn in the chamber through an aperture 136 leading into the upper side. This piston 140 may be vertically fixed to the shaft 130 but rotatable if lower friction is desired. Small bleed holes 138 in the bottom cup 133 permit a differential pressure to be created, and also allow the piston 140 to return to its lower position. When the piston 140 moves up, it displaces the chuck 96 upwardly as well, the movement being permitted by the elbow members 124, 126. At the same time, the lowered pressure from the vacuum line 104 is communicated to a central conduit 142 in the chuck, which conduit includes a radial segment that is open at a reduced diameter portion 144 of the chuck shaft 130. This inset portion of the shaft 130 ensures that the vacuum will be communicated through the conduit 142 to the top central aperture 98 in the chuck 96, and thence through a radial groove 148 to a number of circumferential grooves 149 in the top surface of the chuck 96. This arrangement thus holds the chuck 96 in the upward delta position while the wafer 30 is gripped due to the vacuum applied at the chuck surface.

Moreover, the wafer is also focused under a microscope 20 lens, or for an automatic inspection system 20 while the delta motion and vacuum holddown are still maintained. The lateral arm 112 from the microfocus motor 110 directly controls the position of the delta motion device 102 itself. It also extends or contracts the elbow couplings 124, 126 responsively at the same time. Microfocusing is typically effected by a joystick input to the microprocessor 38, which in turn provides controllable rate and direction signals to the motor 110.

The motor 90 for controlling angular position is a microstepper that can be run at high speed as well as in the slow speed, incremental step mode. Again, joystick control as well as automatic positioning, may be used for angular orientation of the wafer 30.

Wafer transport mechanism—FIG. 1 shows general details of the wafer transport cylinder 40, the enclosed piston 44 and the moving seal 46 which couple to the trolley 42. FIG. 1 also shows the flexible vacuum lines 55 to the tip apertures 54 on the probe 50, and the couplings 152, 153 for pneumatic lined to each end of the cylinder 40. Differential gas pressure applied from one coupling 152 or the other 153 against the piston 44 as determined by the X axis control 45 results in consequent movement to the left or right limit position as seen in FIG. 1. The trolley 42 is directly coupled to the piston 44, and moves responsively, but pressure is not lost because the edges of the movable seal 46, which is configured as a long band, close the longitudinal opening along one side of the cylinder 40. The seal 46 therefore never permits loss of substantial differential pressure to the atmosphere, regardless of trolley movement or position. This arrangement is particularly advantageous because it is compact, permits the usage of two probes, and has low mass. A comparable pneumatic mechanism 62 is used for Y axis control, and also operates between limit positions. It is advantageous to incorporate dashpots (not shown) in each cylinder 40, 62 at the ends of travel for the interior pistons, so as to buffer the deceleration when the limit position is reached.

Vacuum Probe Elements—It will be noted in FIGS. 7 and 8 that the probes, e.g. the first probe 50, have a shallow height dimension, but that the terminal portions have a raised upper surface or pad 156, which in this instance is of "Teflon" material. The vacuum apertures 54 near the tip of the probe 50 lead through grooves 158 on the underside of the probe 50 to the flexible vacuum lines 55 which accommodate movement of a probe between its limit position. A vacuum control 162 (FIG. 1 only) is operated in proper sequence under the control of signals from the microprocessor 38. The underside grooves 158 (FIGS. 7 and 8) are covered by a piece of adhesive tape 164 to maintain the vacuum in a low cost, low profile, fashion. As seen in FIG. 8, this asymmetric approach to supporting the wafer 30 from the underside, with the pad 156 close to but spaced from the wafer 30 edge, is advantageous. There is no contact whatsoever with the coated suface or edges of a wafer 30. A photoresist layer 166 which covers the top and the side edges of the wafer 30 is completely undisturbed during transfer and transport, because the mechanism does not encroach on the photoresist.

Cassette Elevator Mechanism—The cassette elevator mechanism (e.g. the second elevator 28) shown in FIGS. 1 and 2 may be better understood by reference to the partial view of FIG. 8, which depicts only that part of the system. The mechanism is supported in a frame 170, with a motor 172 in the system being controlled by the microprocessor to rotate a lead screw 174 via a belt 176 and pair of pulleys 177, 178. The belt and pulleys are completely enclosed within the frame 170. A block 80 threadedly engaged to the lead screw 174 is driven up or down, dependent on direction of rotation of the motor 170, and guided by a spaced apart pair of rods 182, 183. A platform 185 (shown in phantom only) attached to the block 180 conformingly supports a cassette (not shown) in secure fashion.

A replaceable encoder strip 187 is positioned at one side of the frame 170 and disposed vertically, parallel to an elongated light source 189. The encoder strip 187 has a series of teeth 188 at spacings and positions corresponding to the successive storage positions in the cassette. On the opposite side of the light source 189, an extension from the block 180 carries three small vertically spaced photosensors 190, 191, 192 in alignment with the teeth 188 provide different positional signals for normal, delta up and delta down positions.

The platform 185 and cassette may be driven to any storage location relative to the horizontal plane, which is sensed by counting the number of teeth 188 passing the middle sensor 191, the last prior position being known. To receive a probe under the wafer at that location, the elevator is moved up until the same tooth transition is sensed by the lower sensor 192. When the probe is inserted the elevator is lowered until the upper sensor 190 is at the same tooth 188 position, insuring that the wafer has clearance for removal. The elevator may then be returned to normal position for that location.

In converse fashion the elevator is lowered before a wafer is to be returned, raised to its upper delta limit for transfer and returned to the regular position thereafter. When a different cassette type is inserted, only the replaceable encoder strip 188 has to be changed correspondingly.

While there have been described above and illustrated in the drawings various features and variations in accordance with the invention, it will be appreciated that the invention is not limited thereto but encompasses all forms and modifications within the scope of the appended claims.

What is claimed is:

1. An XY axis positioning system for semiconductor wafers or like elements, comprising:
    (a) a microscope mounted in a midregion of a support above an inspection area;
    (b) an XY stage, further comprising:
        (i) a reference surface;

(ii) a Y-axis bed mounted on the reference surface;
(iii) at least one Y-axis side rail mounted on the Y-axis bed;
(iv) a Y-axis carriage, the Y-axis carriage being slidably attached to the Y-axis side rail, thereby permitting the Y-axis carriage to be translated in a direction parallel to the Y-axis;
(v) a Y-axis motor, the y-axis motor being mounted fixedly with respect to the reference surface, the Y-axis motor serving to drive the Y-axis carriage;
(vi) at least one X-axis side rail, the X-axis side rail being mounted on the Y-axis carriage;
(vii) an X-axis carriage, the X-axis carriage being slidably attached to the X-axis side rail, thereby permitting the X-axis carriage to be translated in a direction parallel to the X-axis, the X-axis carriage being orthogonally movable because of the underlying Y-axis carriage on which the X-axis carriage resides;
(viii) an x-axis motor, the X-axis motor being mounted fixedly with respect to the Y-axis carriage, the X-axis motor serving to drive the X-axis carriage;
(c) an uppermost vacuum chuck, the XY stage including means for rotating and moving the chuck along a vertical Z-Axis and being mounted on the inspection area;
(d) an edge sensor mounted to span the plane of a wafer on the chuck for sensing the edge position of the wafer; and
(e) microprocessor means coupled to control the XY position of the XY stage and responsive to signals from the edge sensor for storing a number of edge position coordinates, and for computing major and minor flats of the wafer therefrom, and location of a center region of the wafer relative to a predetermined axis.

2. The invention as set forth in claim 1, wherein the chuck includes vacuum means in the uppermost surface thereof for gripping the underside of a wafer on the uppermost surface, the vacuum means comprising depressions in the uppermost surface, and the positioning system further includes means for introducing an incremental motion along the vertical axis to enable transfer of the wafer to an associated mechanism.

3. The invention as set forth in claim 2 above, further including a wafer transport mechanism positioned to transport the wafer in a horizontal plane and including probe means having a vacuum tip portion for retaining the wafer adjacent one edge only of the wafer without contacting the edge.

* * * * *